United States Patent [19]

Albright

[11] Patent Number: 4,902,987

[45] Date of Patent: Feb. 20, 1990

[54] INDUCTIVE MODULATOR SYSTEM

[76] Inventor: Eugene A. Albright, 1404 E. Myrna La., Tempe, Ariz. 85284

[21] Appl. No.: 341,769

[22] Filed: Apr. 21, 1989

[51] Int. Cl.⁴ .............................................. H03C 1/00
[52] U.S. Cl. .................................... 332/120; 332/145; 332/173
[58] Field of Search .................... 332/17, 22, 41, 51 R

[56] References Cited

U.S. PATENT DOCUMENTS 3,172,061  3/1965  Malinowski .................. 332/51 R X Primary Examiner—Eugene R. LaRoche
Assistant Examiner—Robert J. Pascal
Attorney, Agent, or Firm—LaValle D. Ptak

[57] ABSTRACT

A magnetic induction modulation and frequency multiplication system includes three toroidal coils physically mounted close to one another to provide magnetic flux coupling between them. One of the coils is supplied with a relatively high frequency carrier signal which has been shaped to eliminate one or the other of the positive or negative excursions thereof. A second coil is provided with an audio signal or other suitable input signal. The third coil constitutes the output coil and is utilized to provide signals to a transmitting circuit coupled to a transmitting antenna. The output signal from the third coil constitutes an amplitude modulated and phase/frequency modulated signal directly produced through the mutual inductive coupling of the three coils.

38 Claims, 3 Drawing Sheets

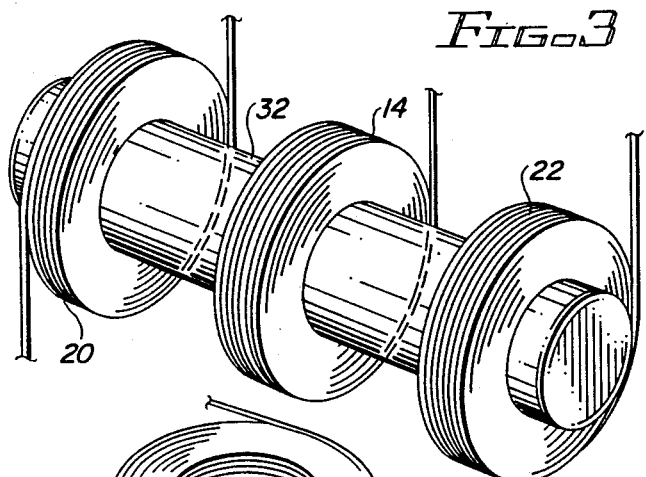
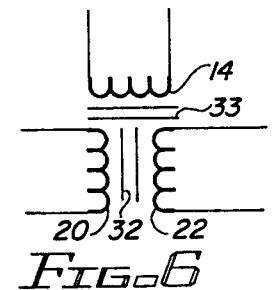
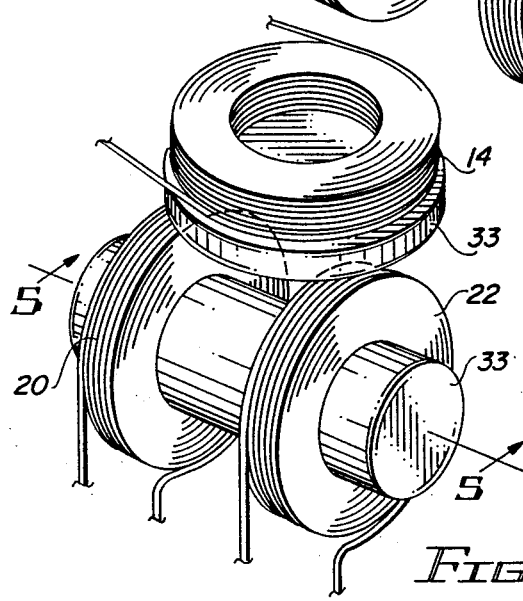
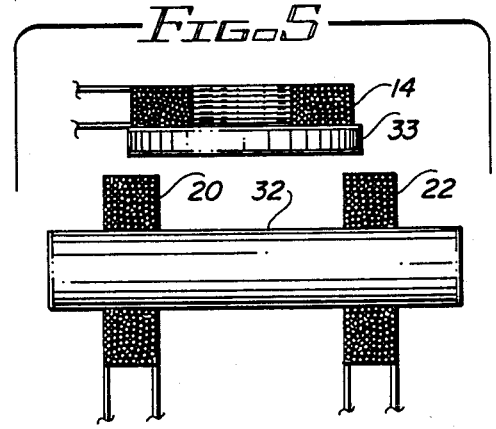
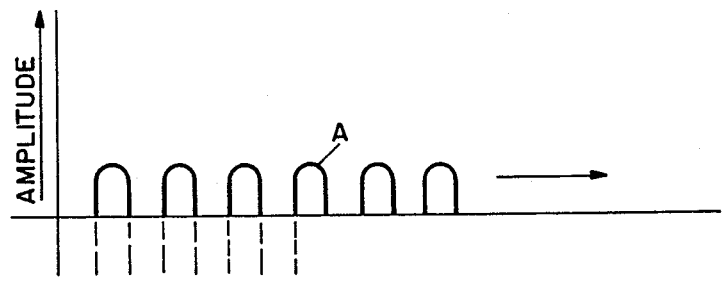
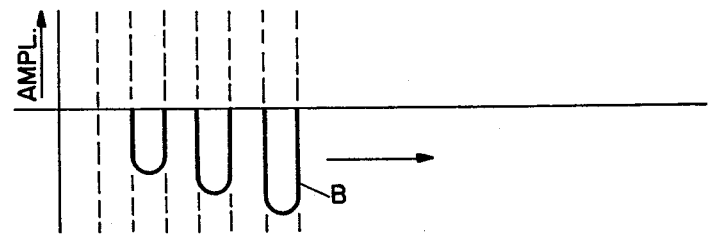
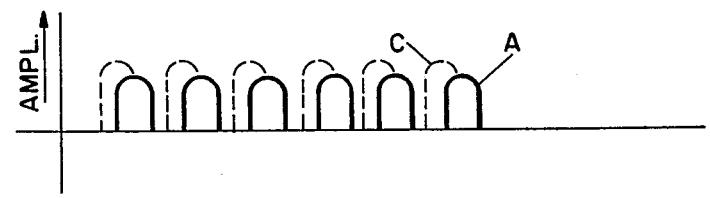

INDUCTIVE MODULATOR SYSTEM

BACKGROUND

Placing information in the form of electrical signals, usually in the audio ranges, onto a much higher frequency signal for the purpose of transmitting that information through space is called modulation. Radio and television transmission at different assigned frequencies or narrow frequency bands, determined by the higher frequency signal (the carrier frequency), is detected at the receiving end by tuning the receiver to the desired frequency band. The signals then are "demodulated" to provide the audio signals or other electrical signals at the receiver. Typically, the signal which is being modulated (the carrier signal) is a sine wave signal of constant amplitude. The signal which then varies some parameter of this sine wave carrier signal (either its amplitude or phase, for example) is known as the modulating signal.

Amplitude modulation of a carrier signal is widely used; and the particular form has different subdivisions, such as double sideband (DSB), single sideband (SSB), variable sideband (VSB), and others. Circuits for providing these different types of modulation are common and well known. In simple amplitude modulation, typically there are two sidebands generated (DSB) and each of these sidebands contains approximately one-sixth (1/6th) of the total power. At the receiver, only one of the two sidebands is used to demodulate the signal. The energy or power in the other sideband is wasted.

Single sideband transmission without a carrier is a relatively efficient transmission technique, but it is complex and requires extensive circuits and phase and frequency matching to reinsert the carrier at the receiver prior to demodulation of the desired modulating signal. Single sideband transmission may be considered a simple frequency translation of the baseband (information) or modulating signal to a higher frequency more suitable for propagation from a transmitter to a receiver.

The known amplitude modulation systems, single sideband or double sideband, typically have a limit on the relative strength of the modulating signal to the strength of the carrier signal. This limit is considered 100% modulation, that is, the modulating signal cannot exceed the strength of the carrier signal. Typically, the power of the carrier signal is selected in accordance with the desired transmitting characteristics, and the modulating signal (which contains the desired information) is a relatively small fraction of the carrier signal.

Other types of signal modulation, such as phase or frequency modulation, also are widely employed. Phase and frequency modulation transmission enjoy advantages over amplitude modulation transmission, primarily in the relative freedom from static and other signal distortion which occurs in amplitude modulation transmission due to weather conditions and other factors. The basic underlying techniques for combining the carrier signal and the modulating signal (the desired information signal), however, are similar, regardless of which type of modulation is employed. The carrier signal is selected to be of a higher power than the modulating or information signal.

Typical transmitting stations, whether for AM transmission, FM transmission, or television transmission, operate at extremely high power levels. For such stations to have any reasonable range or receiving area, the transmitting power is many thousands of watts. Consequently, the transmitting station equipment is necessarily expensive because of the high power requirements of all of the components used to produce and transmit the radio frequency signals. In addition, because of the high levels of power consumption, the basic cost of the electricity used by such stations is very high and constitutes a significant percentage of the expense of operating the stations.

Typical transmitting stations combine the various signals together, prior to transmission, through the use of active amplifier and active electronic mixing devices. Multiple plate vacuum tubes and similar components are utilized for this purpose. Because of the high power requirements, the electronic components are large and expensive. The high power requirements also subject transmitting stations to relatively high maintenance requirements. Typically, maintenance engineers are actively on duty during at least a major portion of the transmitting day.

It is known that when alternating current flows through a conductive coil (any coil), the current first flows in one direction through the coil for one half-cycle of the driving alternating voltage and then flows in the opposite direction through the other half-cycle of the alternating driving voltage. The first half of the positive half-cycle is an acceleration voltage and the other half of the positive half-cycle is a deceleration voltage. The voltage starts at zero and then increases to a peak at the mid point of the first half-cycle and then decreases back to zero to complete such a half-cycle. The following opposite half-cycle is the same, except that the acceleration-peak-deceleration voltage is exactly reversed in direction from that of the preceeding half-cycle.

The charge carrier motion of this current generates a magnetic field, which is at right angles to the direction of the charge carrier motion in the wire of the coil. Consequently, the coil is surrounded by a magnetic flux with a north/south orientation at any given moment of time. This orientation is dependent upon the direction of the current in the coil.

Obviously, if the current in the coil is a direct current (DC), the coil has a permanent non-varying north-/south orientation. This is the same as the magnetic flux or magnetic field around a flat circular ceramic magnet which has a hole in its center. Empirically, such a magnet is identical to a torodial coil energized by a DC current. The amount of current (power) necessary to cause a coil to have the same magnetic flux intensity (gauss intensity) as a given ceramic magnet intensity is very high. Consequently, the use of a ceramic magnet instead of a coil represents great savings in the amount of power necessary to produce the same magnetic effect.

Faraday's "lines of force", along with magnetic north poles and magnetic south poles, are created fictions for the sake of mathematical formulas dealing with magnetism and also to provide a way of producing mental pictures useful in studying magnetic theories. Such magnetic poles and lines of force are not actual facts of Physics or objective items. There are neither "lines of force" nor "magnetic poles". What does exist is a direction of the movement of charge carriers, electrons, etc. in a conductor under the influence of a driving force or voltage. In a coil, the direction of this movement determines if the top of the coil is a magnetic "north" pole or is a "south" pole, and the north/south orientation is at right angles to the direction of the charge carriers or electron flow in the wire or coil. Even a single electron in a circular orbit produces a magnetic dipole with a north/south orientation. This orientation is at right angles to the orbit of the electron as determined by the relative direction of the movement of the electron in such orbit.

It also is known that when two coils are placed in close proximity to one another, a change in the magnetic flux of one of these coils, either caused by a magnet being pushed or pulled into the coil, or caused by a change in the current flowing through the coil, causes a corresponding change in the flux of the other coil. Both coils are inductively coupled by the magnetic flux, and the coil which is connected only by the magnetic field or magnetic flux has an electromagnetic force induced in it by changes in the flux of the other or inducing coil. This induced electromagnetic force (EMF) is proportional to the rate at which the current is changing in the inducing coil. The induced current appears in such a direction that it opposes the change that produces it.

It is desirable to provide a modulation and/or frequency multiplier system which is not subject to the limitations of the known transmitting art, and which utilizes the unique characteristics of magnetic induction to provide simple, low cost generation of any desired modulation type.

SUMMARY OF THE INVENTION

It is an object of this invention to provide an improved modulation system.

It is another object of this invention to provide an improved inductive modulator and frequency multiplier.

It is an additional object of this invention to provide an improved single sideband (SSB) transmission technique.

It is a further object of this invention to provide an improved inductive modulator single sideband transmitter system.

It is yet another object of this invention to provide an improved frequency multiplication system.

It is still an additional object of this invention to provide an improved modulation system which employs inductive modulation to combine a modulating signal with a carrier signal for simultaneously producing different types of modulation on the carrier, one or more of which may be selected for subsequent transmission.

In accordance with the preferred embodiment of this invention, an inductive modulator system includes a source of carrier input signals and a source of information input signals. A first coil is connected to the source of carrier input signals and a second coil then is inductively coupled to the first coil and has the source of information input signals connected to it. A third output coil is inductively coupled to the first and second coils to provide a modulated output signal, as a result of the carrier input signals and information input signals supplied to the first and second coils.

BRIEF DESCRIPTION OF THE DRAWINGS

FIGS. 3 and 4 illustrate alternative variations of the embodiment shown in FIG. 2;

FIG. 5 is a cross-sectional view of the embodiment of FIG. 4;

FIG. 6 is schematic diagram of the embodiment shown in FIGS. 4 and 5;

FIGS. 7A through 7E are waveforms used in explaining operation of the embodiment of FIG. 1;

DETAILED DESCRIPTION

Figure 1:
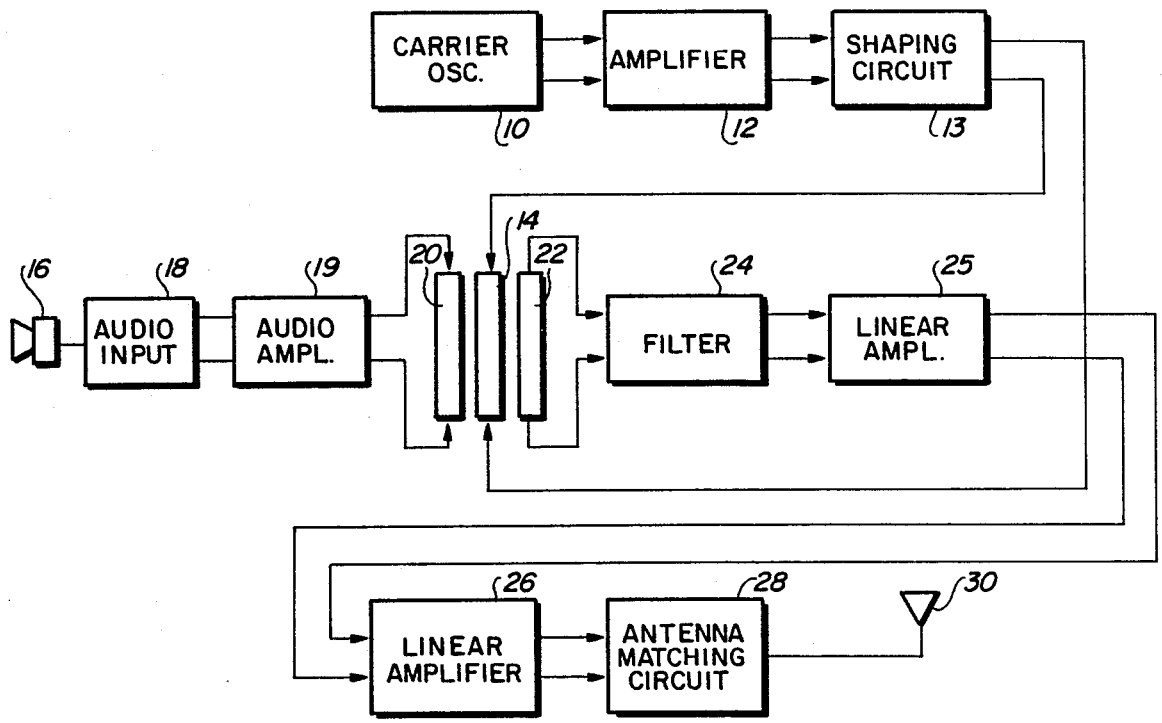
FIG. 1 is a block diagram of a system of a preferred embodiment of the invention.

Reference now should be made to the drawings in which the same reference numbers are used throughout the different figures to designate the same components. FIG. 1 is a block diagram of a magnetic induction modulation system in accordance with the preferred embodiment of the invention.

As shown in FIG. 1, the system includes a conventional radio frequency carrier oscillator 10 which operates at the desired RF transmission frequency, or at subharmonic of that frequency. The oscillator 10 is conventional and supplies its output signals to a suitable amplifier 12, also of conventional configuration. In accordance with the invention, the output of the amplifier 12 is supplied through a shaping circuit, which typically comprises a half-wave rectifier circuit for producing half-wave or uni-polar signals at the carrier oscillator frequency. These signals may be either the positive or negative half cycles of the alternating signal produced by the carrier oscillator and supplied through the amplifier 12. Thus, they constitute a pulsating direct current (DC) carrier. The output of the shaping circuit 13 then is applied to the central toroidal core 14 of three inductively coupled cores 14, 20, and 22, as illustrated most clearly in FIGS. 1 and 2. As a result, the current through the core 14 constitutes a sequence of half-wave pulses, such as the pulses A, shown in FIG. 7. Thus, the flux through the core 14 is a constantly changing uni-polar flux having a magnetic field pattern corresponding to the amplitude pattern of FIG. 7A, matching the changes in current produced at the output of the shaping circuit 13.

Suitable input signals, such as audio signals, are detected by a microphone 16 and are supplied through an audio input circuit 18 and an audio amplifier 19, which are of conventional configurations. The output of the audio amplifier 19 then is applied to the terminals of the toroidal coil 20. As is common with all RF transmission systems, the frequency variations of the signals supplied to the coil 20 from the audio amplifier 19 are much lower than the frequency of the signals supplied to the coil 14.

The coils 14 and 20, as well as an output toroidal coil 22, all are placed in close physical proximity to one another, so that the inductive magnetic fields of these various coils interact, that is, each of the coils are placed in the inductive fields of the others. The effect of this is to produce multiple modulations of the carrier 14 as picked up on the output coil 22. Specifically, the half-wave carrier is reproduced in the coil 22; but it is modulated by the signals supplied to the coil 20 in phase (or angle), frequency, and in amplitude. All of these modulations simultaneously exist in the composite output signal produced by the coil 22; and all of these signals are unidirectional or uni-polar, not double sideband.

Figure 7D:
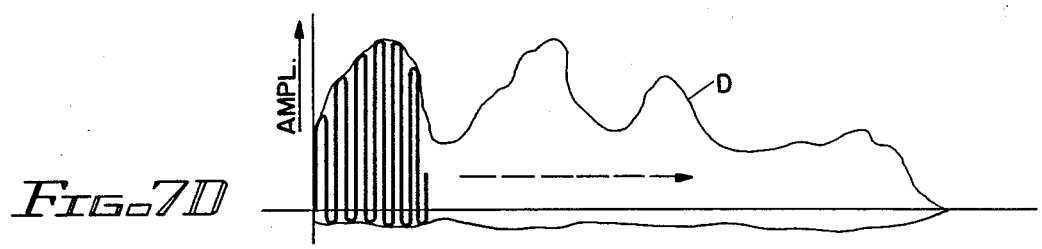
Figure 7E:
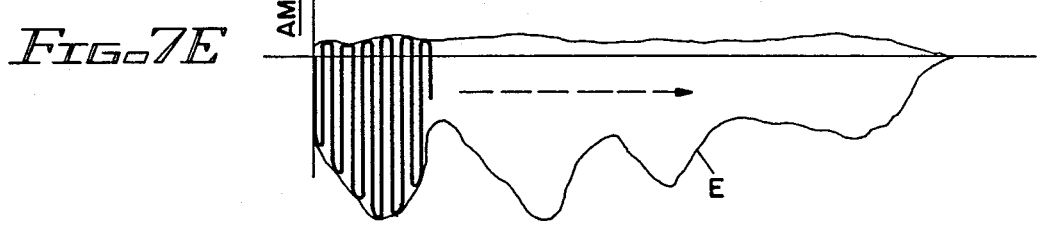

Measurements have been made on a BK Precision oscilloscope #1590-A, and the general modulation patterns shown in FIGS. 7A through 7E exist. The modulation signal appears in the missing half-cycle part of the carrier waveform 7A, as shown in FIG. 7B. The sweep rate of the oscilloscope was set to show the carrier frequency on the scope. Thus, the audio, or other modulation signal, imprints during the zero current timing of the half-wave carrier. (The theoretical limit for the bandwidth possible is one/half of the carrier frequency. This would make multiplex transmission, single sideband, very simple). When the oscilloscope was moved to coil 22, with the sweep rate set to the audio range, the amplitude modulation which resulted from the mixing process between the coils 14 and 20, is shown in FIGS. 7D and 7E, as the signal produced in coil 22. Amplitude modulation of over 700% has been measured, because only the positive half of the carrier wave is used, which has no theoretical limit. FIGS. 7D and 7E are the mirror images of each other, with the difference caused by rotating the coil 22 with respect to the coil 14 by 180° to achieve the selected waveform of either FIG. 7D or 7E.

Simultaneously with the production of the amplitude modulated signal, the carrier is subjected to phase or angle modulation, as indicated in the dotted line waveform shown in FIG. 7C. Both amplitude and angle modulation are present as well as the carrier wave. Note, in FIGS. 7D and 7E, that about 5% of the carrier is below the zero line, which preserves the frequency of the signal without having to re-insert it at the receiver.

Figure 9:
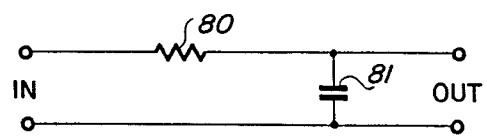
FIG. 9 is a circuit diagram of a circuit which may be used with the embodiments of FIGS. 1 and 8.

If FM or frequency modulation transmission is desired, this angle modulation may be converted to FM modulation by supplying the signal through a suitable filter (such as the filter 74) to convert the angle modulation to FM modulation. This may comprise a standard technique in the form of a simple network circuit of the type comprising a resistor 80 and a capacitor 81, as shown in FIG. 9.

The filter 24 which is connected to the output of the output coil 22 selects the desired type of modulation which is to be transmitted from the transmitting station. The output of the filter 24 is applied to a pair of cascaded, conventional, linear amplifier circuits 25 and 26 to provide an amplified signal for an antenna matching circuit 28. The output of the circuit 28 is supplied to a suitable transmitting antenna 30 which transmits the uni-polar pulsating signal (or combination of signals) desired from the transmitting station.

It should be noted that it is possible to transmit both frequency modulated (FM) and amplitude modulated (AM) signals simultaneously at the same carrier frequency from the antenna 30. Selection of the desired one of these signals then is effected by the type of receiver at the receiving station which is tuned to the carrier frequency of the transmitted signals. If an AM receiver is used, and is tuned to the carrier frequency, that receiver, unaltered in any way from conventional receivers now in use, reproduces the AM signal modulation. Similarly, an FM receiver, tuned to the carrier frequency, reproduces the transmitted FM signals. Conventional FM or AM receivers may be used without modification to receive signals transmitted by the system of FIG. 1.

Figure 2:
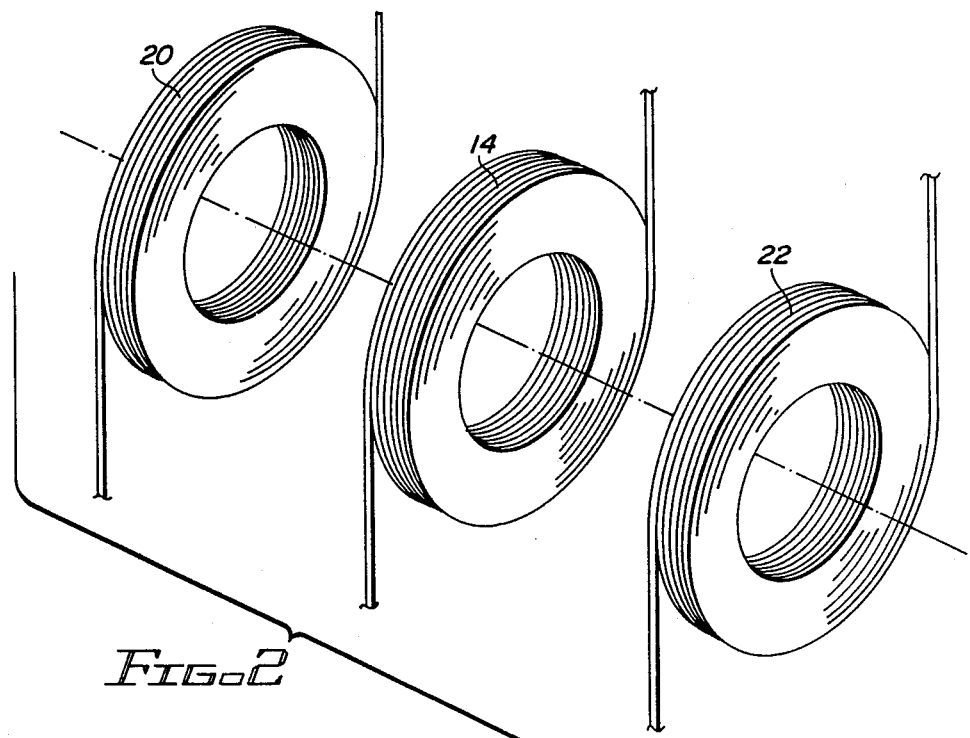
FIG. 2 illustrates details of a portion of the embodiment of FIG. 1.

FIG. 2 is a perspective diagrammatic representation of the arrangement and interrelationship of the toroidal coils 14, 20, and 22, used in the embodiment of FIG. 1. As illustrated in FIG. 2, the coils 14, 20, and 22 are located in close proximity to one another and are air coupled. The actual physical location of the coils is to place them as close as possible, so that the full effects of magnetic flux produced in the coils 14 and 20 is combined and reproduced in the output coil 22. For a working, low power embodiment, the three coils each were four inch coils, each having one hundred-ten (110) turns of number 22 enameled copper wire. Each of the coils 14, 20, and 22 of this embodiment had a DC resistance of 2.50 ohms. Coils of this size would not be used in a circuit designed for commercial transmitters, but this arrangement clearly demonstrated the effective operation of the system.

In any actual commercial circuit, the coils 14, 20, and 22 are selected to be correct for the frequency used as the carrier frequency. In addition, the audio frequency signal may be enhanced by the use of ferrite cores which reduce the necessity for high power. Such a configuration is shown in FIG. 3 where a cylindrical ferrite core 32 is shown passing through the centers of the toroidal coils 14, 20, and 22. In all other respects the embodiment of FIG. 3 is identical to the one of FIG. 2. The use of ferrite cores, such as the core 32, reduces the power requirements of any system over the air coupled arrangement shown in FIG. 2. The ferrite core functions effectively to multiply the effective flux from the carrier and the audio modulating signal to permit a reduction in size of any device for a given power level. In fact, if the modulation is done at a low power level, the signal is placed on the carrier and detected by the core 22; and the resulting modulated signal then may be brought up to the desired power level by the linear amplifiers 25 and 26, such as is done with conventional SSB transmitters currently in use.

If it is desired to modulate the carrier signal at a higher power level, for example at 100 watts, the carrier is amplified by the amplifier 12 or cascaded amplifiers to the desired level. The audio power level then may be designed to produce a magnetic field through the use of ferrites or other suitable core materials to provide hundreds of times the gauss level of the coil itself. Since the flux density of the magnetic field which is produced by the currents flowing through the coils 14 and 20 is used as the modulating process, there is an advantage of significant flux multiplication by utilization of a suitable core material. Because the carrier and the modulating signals have been converted to magnetic flux, rather than either voltage or current, as is used in conventional modulator circuits, it becomes a matter of the degree of flux density rather than watts. For example, a twenty-five watt audio signal can be multiplied to the same flux density as two hundred (200) or three hundred (300) watts if only a coil without a ferrite core were to be used. Consequently, the input of twenty-five (25) watts of audio power into a coil, which has a high permeability core through it, can produce an effective flux density which is equal to an excess of a two hundred (200) watt input. When this flux is placed in conjunction with the flux of the half-wave carrier signal, the effective output for the modulated carrier signal in this example is approximately three hundred (300) watts. Experiments using high permeability ferrite cores have illustrated that the actual value of the flux density (B) is greatly increased over an air core arrangement for any given current level.

Because power is added in the negative part of the modulated wave, as shown in FIG. 7B, (the portion carrying the modulation signal), the phase or FM modulation no longer is limited to taking power from the carrier and placing it into the sideband as with a conventional phase or FM signal. The result is an amplitude modulated, phase and frequency modulated carrier which takes power from the lower sideband and adds it to the generated harmonic sideband of the phase or frequency modulated signal. Power may be generated from the audio modulation signal and multiplied through the use of flux increases created by the high value ferrite material. The effective radiated power is the same, but the power input requirements for the system are decreased substantially.

By using only the positive (or negative) half of an AC carrier, modulation is not limited to 100%. This is true because when unidirectional or uni-polar carrier is generated, there is no lower sideband created. This eliminates the equal and opposite effect of double sideband, which effect acts to cancel or reduce the power possible to the sidebands because one is positive going and the other is negative going in direction. Also, because the pulsating current in the carrier coil 14 is only unidirectional, without an opposite current flow, no opposite sideband can be created because the carrier in the coil 14 is at zero current during the opposite half of the generated carrier wave. A sideband cannot be generated if there is no band, (carrier), with which to do it. Only the modulation signal applied to the coil 20 is producing a current flow during this negative half cycle (when a positive unidirectional carrier is used), the carrier is effectively off during this time. The direction of the current flow in a normal AC carrier reverses at the rate of the carrier frequency. This reversal of the direction of the current flow for the carrier wave in the present system has been eliminated. Only one sideband is possible and being without its limiting opposite sideband, modulation of the carrier at 300 to 900% modulation is possible, as the positive half of a carrier wave is unlimited, in theory, as to how much power can be put into it from the modulator.

Approximately twenty-five to forty percent less power is needed to transmit the same effective power level as standard transmission. Thus, a transmitting station which currently, using conventional equipment, requires one hundred thousand (100,000) watts of power may produce the same effective transmitting range at a power level of sixty thousand (60,000) watts to seventy-five thousand (75,000) watts using the modulation system of FIG. 1. At the same time, many of the complex circuits now necessary for standard transmitting stations may be eliminated or reduced in complexity; so that the cost of the transmitting station also is reduced. Amplitude-phase modulation now may be accomplished directly, as explained above, without the high cost and complexity which present techniques require for such modulation.

Because all of the results of this technique are unipolar or unidirectional and the carrier is both phase and frequency modulated, a high number of harmonic sidebands are produced in addition to the fundamental frequency. Measurements have been made as high as the four hundred twentieth harmonic. For frequency of 0.25 MHz used as a carrier, clear signals at 105 MHz have been obtained from a conventional portable FM receiver, located fifty feet away without the use of an FM antenna and with an input RF power to the coil 14 of only fifty (50) milliwatts. No resonant tuning was employed and no antenna was necessary, only the coupling between the coils 14, 20, and 22 produced the desired result. Therefore, a unique and valuable frequency multiplier inherently exists in the system which is illustrated in FIG. 1. This multiplier generates frequencies in the range, for example, from 1 MHz to 105 MHz in a single step, but provides the frequencies at any of the various harmonics already modulated both in frequency and phase, as well as amplitude. As a result, the filter 24, which is employed in the circuit of FIG. 1, is selected to provide either pure frequency modulation, phase modulation, or amplitude modulation at the desired output carrier frequency for further amplification on up to the desired power level for transmission. At the same time, the system requires only half as much of the band-width of normal or conventional AM/FM or phase modulation transmission systems.

Another variation of the coil arrangement shown in FIGS. 2 and 3 is illustrated in FIGS. 4, 5, and 6. In these figures, the audio signal input coil 20 and the output coil 22 are shown wound on a common ferrite core 32, which is similar to the core 32 of the embodiment of FIG. 3. The carrier coil 14, however, is not placed on the core 32, but instead the coil 14 is oriented at right angles to the axis of the cores 20 and 22, and is located on an axis perpendicular to the axis through the ferrite core 32. In addition, the coil 14 is attached to a flat ceramic permanent magnet plate 33, so that the flux changes produced by the current flowing through the carrier signal coil 14 result in corresponding variations in the magnetic field on the other face of the ceramic magnet plate 33. The flux coupling of the three coils 14, 20, and 22, results in an output signal from the coil 22 which is comparable to the one described above in conjunction with the embodiments of FIGS. 2 and 3 and also described in conjunction with the waveforms of FIG. 7.

Figure 8:
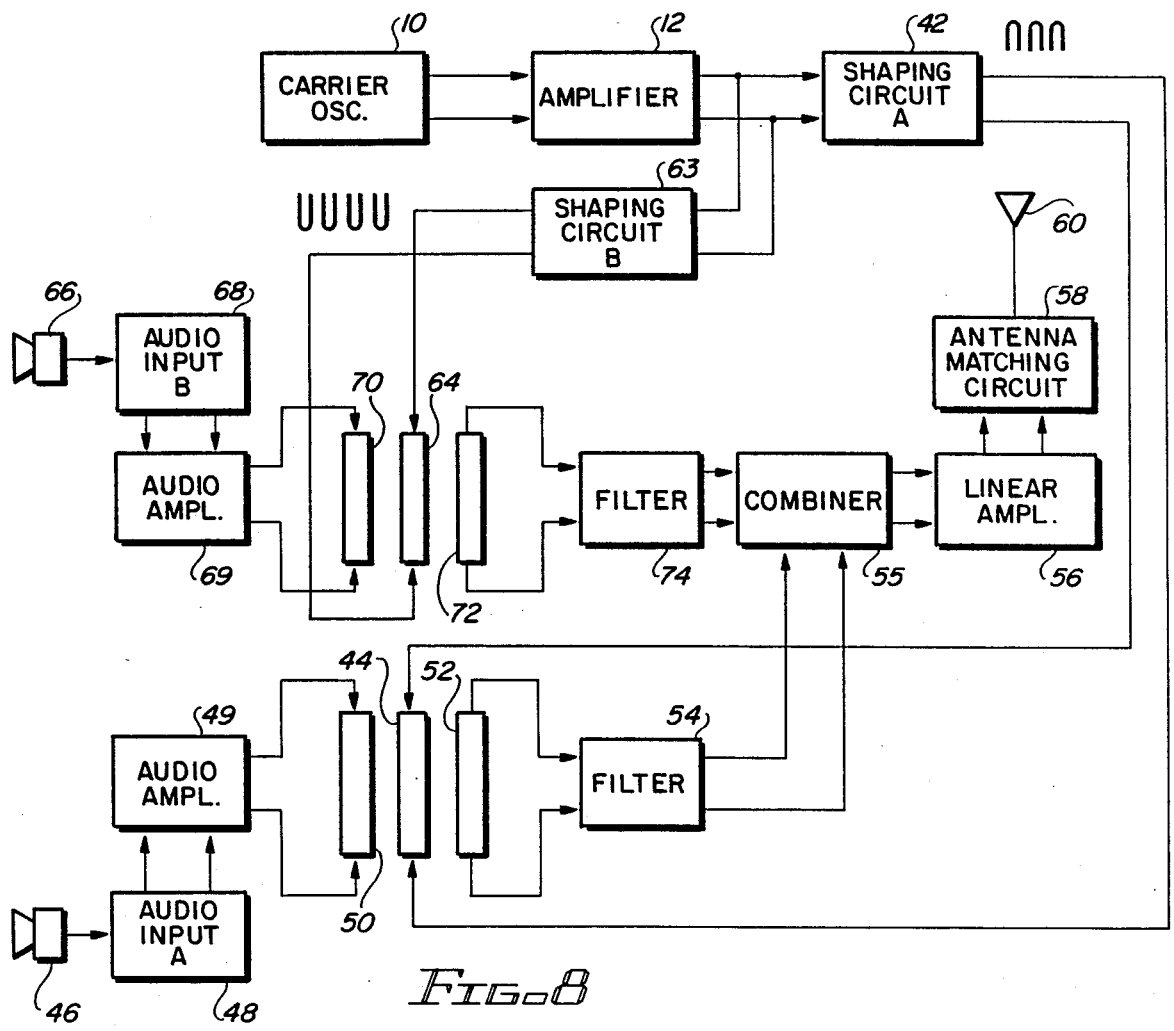
FIG. 8 is a variation of the embodiment shown in FIG. 1 used for producing stero signal transmission.

Reference now should be made to FIG. 8, which illustrates a modification of the circuit of FIG. 1 for use as an AM stereo or FM stereo transmitting system. By producing the positive carrier half-cycles for the right channel and the negative carrier half-cycles for the left channel as separate signals prior to amplification in the final power amplifier, the separate signals can be combined in the final stages to form a normal appearing, amplitude modulated signal, as far as the antenna 60 is concerned. Different information, however, is contained in the positive and negative portions of this signal. This is accomplished by the circuit of FIG. 8.

For example, a single carrier oscillator 10 and an amplifier 12 are utilized, as in the embodiment of FIG. 1. The output of the amplifier 12, however, is supplied to two different shaping circuits 42 and 63. The shaping circuit 42 supplies, for example, the positive half-cycles of the carrier oscillator signal, while the shaping circuit 63 provides the negative half-cycles of the carrier oscillator signal. If the output of these two circuits were recombined, a full sine wave carrier signal at the frequency of the oscillator 10 would result. The two halves of this signal, however, are separately provided at the outputs of the shaping circuits 42 and 43.

As illustrated in FIG. 8, the output of the shaping circuit 42 is supplied to a carrier input coil 44. The audio input for the corresponding portion of the stereo input signal is supplied through a microphone 46, an audio input circuit 48, and audio amplifier 49 connected to the audio input modulator coil 50. An output coil 52, corresponding in operation to the output coil 22 of FIG. 1, supplies output signals through a filter 54 connected to a combiner circuit 55.

At the same time, the output of the shaping circuit 63 is supplied to a circuit which is a duplicate of the one connected to the output of the shaping circuit 42. The carrier signals are supplied to a carrier toroidal coil 64, while the audio input signals for the other audio channel are supplied through a microphone 66, input circuit 68, and audio amplifier 69 to an input coil 70. An output coil 72, comparable to the output coil 22 of FIGS. 1 through 4, supplies the modulated signals for this channel to a filter 74. These signals are combined with the signals from the filter 54 in the combiner circuit 55 which then produces the full stereo signal to a conventional linear amplifier circuit 56. The circuit 56 amplifies the signal to the desired transmission level and supplies it through an antenna matching circuit 58 to a transmitting antenna 60.

As far as the antenna 60 is concerned, the signal which is transmitted is a normal appearing amplitude modulated signal (provided that amplitude modulation is selected by the filters 54 and 74). The system which is illustrated in FIG. 8 also may be used to produce FM stereo signals. The same process of separate and independent upper and lower sidebands is employed. No changes are necessary whatsoever to the circuits which are connected to the inputs of the filters 54 and 74. These filters are selected to pass the desired modulated frequency signal on to the combiner 55. At the receiver, the positive unidirectional signal is selected by one channel and the negative unidirectional signal is selected by the other, utilizing conventional FM receiver techniques.

The foregoing description of the preferred embodiments is to be considered as illustrative of the invention and not as limiting. Various changes and modifications will occur to those skilled in the art without departing from the true scope of the invention, which may take a variety of different forms other than the ones illustrated for the preferred embodiments of FIGS. 1 through 8.

I claim:

1. An inductive modulator system including in combination:
    a source of carrier signals including a shaping circuit for supplying unidirectional pulses on the output of said source of carrier signals;
    a source of information input signals;
    a first coil connected to the output of said source of carrier signals;
    a second coil connected to said source of information input signals and inductively coupled with said first coil; and
    a third coil inductively coupled with said first and second coils for supplying an output signal therefrom.

2. The combination according to claim 1 wherein said first, second and third coils each are toroidal coils.

3. The combination according to claim 2 further including means coupled with said third coil for supplying signals to a transmitting antenna.

4. The combination according to claim 3 wherein said shaping circuit comprises half-wave rectifier means.

5. The combination according to claim 4 wherein the power level of said source of information input signals is greater than the power level of said source of carrier signals.

6. The combination according to claim 5 wherein each of said coils are oriented on a common axis.

7. The combination according to claim 6 wherein said power level of said source of information input signals is several times greater than the power level of said source of carrier signals.

8. The combination according to claim 7 wherein said source of information input signals is an audio signal input.

9. The combination according to claim 8 wherein said first, second and third coils are mounted on a common ferrite core.

10. The combination according to claim 1 wherein said first and third coils are on a first common axis and said second coil is located on an axis perpendicular to said first axis.

11. The combination according to claim 10 wherein said second axis intersects said first axis between said first and third coils.

12. The combination according to claim 11 further including first and second magnetic cores, wherein said first and third coils are mounted on said first core and said third coil is mounted on said second core.

13. The combination according to claim 12 wherein said first, second and third coils each are toroidal coils.

14. The combination according to claim 13 wherein the power level of said source of information input signals is greater than the power level of said source of carrier signals.

15. The combination according to claim 14 further including means coupled with said third coil for supplying signals to a transmitting antenna.

16. The combination according to claim 15 wherein said source of carrier signals further includes a shaping circuit for supplying unidirectional signal pulses to said first coil.

17. The combination according to claim 16 wherein said shaping circuit comprises half-wave rectifier means.

18. The combination according to claim 1 further including means coupled with said third coil for supplying signals to a transmitting antenna.

19. The combination according to claim 1 wherein said first, second and third coils are mounted on a common ferrite core.

20. The combination according to claim 1 wherein each of said coils are oriented on a common axis.

21. The combination according to claim 1 wherein said source of information input signals is an audio signal input.

22. A dual signal inductive modulator system including in combination:
    a first source of carrier signals;
    a first source of information input signals;
    a first coil connected to said first source of carrier signals;
    a second coil connected to said first source of information input signals and inductively coupled with said first coil;
    a third coil inductively coupled with said first and second coils for supplying an output signal therefrom;
    a second source of carrier signals;
    a second source of information input signals;
    a fourth coil connected to said second source of carrier signals;
    a fifth coil connected to said second source of information input signals and inductively coupled with said fourth coil;
    a sixth coil inductively coupled with said fourth and fifth coils for supplying an output signal therefrom; and means for combining the output signals from said third and sixth coils to produce a composite output signal.

23. The combination according to claim 22 wherein said first, second and third coils are oriented on a first common axis and said fourth, fifth, and sixth coils are oriented on a second common axis.

24. The combination according to claim 23 wherein said first and second sources of information input signals are different channels of stereophonic audio signals.

25. The combination according to claim 24 further including a transmitting antenna, wherein said combining means supplies said composite output signals to said transmitting antenna.

26. The combination according to claim 25 wherein said first and second sources of carrier signals comprise first and second shaping circuits connected to a common carrier signal generator for supplying opposite polarity unidirectional signal pulses, respectively, to said first and fourth coils.

27. The combination according to claim 26 wherein said first and second shaping circuits each comprise half-wave rectifier means.

28. The combination according to claim 27 wherein the power level of said first and second sources of information input signals is greater than the power level of said first and second sources of carrier signals.

29. The combination according to claim 28 wherein said coils each are toroidal coils.

30. The combination according to claim 29 wherein said first, second and third coils are mounted on a first common ferrite core and said fourth, fifth and sixth coils are mounted on a second common ferrite core.

31. The combination according to claim 22 wherein said first and second sources of information input signals are different channels of stereophonic audio signals.

32. The combination according to claim 22 further including a transmitting antenna, wherein said combining means supplies said composite output signals to said transmitting antenna.

33. The combination according to claim 22 wherein the power level of said first and second sources of information input signals is greater than the power level of said first and second sources of carrier signals.

34. The combination according to claim 22 wherein said first and second sources of carrier signals comprise first and second shaping circuits connected to a common carrier signal generator for supplying opposite polarity unidirectional signal pulses, respectively, to said first and fourth coils.

35. The combination according to claim 37 wherein said first and second shaping circuits each comprise half-wave rectifier means.

36. The combination according to claim 35 wherein said first and second sources of information input signals are different channels of stereophonic audio signals.

37. The combination according to claim 22 wherein said coils each are toroidal coils.

38. The combination according to claim 22 wherein said first, second and third coils are mounted on a first common ferrite core and said fourth, fifth and sixth coils are mounted on a second common ferrite core.

* * * * *